(12) United States Patent
Gao et al.

(10) Patent No.: US 10,993,327 B2
(45) Date of Patent: Apr. 27, 2021

(54) CIRCUIT BOARD AND METHOD FOR MANUFACTURING THE SAME

(71) Applicants: Avary Holding (Shenzhen) Co., Limited., Shenzhen (CN); QING DING PRECISION ELECTRONICS (HUAIAN) CO., LTD, Huai an (CN)

(72) Inventors: Lin-Jie Gao, Shenzhen (CN); Yong-Quan Yang, Qinhuangdao (CN); Han-Pei Huang, Hsinchu (TW)

(73) Assignees: Avary Holding (Shenzhen) Co., Limited., Shenzhen (CN); QING DING PRECISION ELECTRONICS (HUAIAN) CO., LTD, Huai an (CN)

( * ) Notice: Subject to any disclaimer, the term of this patent is extended or adjusted under 35 U.S.C. 154(b) by 38 days.

(21) Appl. No.: 16/522,836

(22) Filed: Jul. 26, 2019

(65) Prior Publication Data

US 2020/0413544 A1    Dec. 31, 2020

(30) Foreign Application Priority Data

Jun. 28, 2019  (CN) .......................... 201910577691.4

(51) Int. Cl.
| | |
|---|---|
| H05K 1/18 | (2006.01) |
| H05K 1/02 | (2006.01) |
| H05K 3/30 | (2006.01) |
| H05K 3/46 | (2006.01) |
| H01Q 1/22 | (2006.01) |
| H05K 1/11 | (2006.01) |

(52) U.S. Cl.
CPC ........... *H05K 1/186* (2013.01); *H01Q 1/2283* (2013.01); *H05K 1/028* (2013.01); *H05K 1/112* (2013.01); *H05K 1/189* (2013.01); *H05K 3/303* (2013.01); *H05K 3/4602* (2013.01); *H05K 2201/10098* (2013.01); *H05K 2203/1383* (2013.01)

(58) Field of Classification Search
None
See application file for complete search history.

(56) References Cited

U.S. PATENT DOCUMENTS

| | | | | |
|---|---|---|---|---|
| 6,678,167 | B1 * | 1/2004 | Degani | ............... H01L 23/36 257/E23.101 |
| 2011/0227794 | A1 * | 9/2011 | Fratti | .................... H01Q 1/243 343/700 MS |
| 2013/0341075 | A1 * | 12/2013 | Becker | ................. H05K 3/0064 174/255 |
| 2016/0113125 | A1 * | 4/2016 | Chen | ..................... H05K 3/4691 29/846 |
| 2017/0207524 | A1 * | 7/2017 | Cardinali | ................ H01Q 9/42 |

\* cited by examiner

*Primary Examiner* — Anh Q Tran
(74) *Attorney, Agent, or Firm* — ScienBiziP, P.C.

(57) ABSTRACT

A method for manufacturing a circuit board with a small size a communication unit comprising a radio frequency (RF) component, an antenna, and an encapsulation layer. The RF component is embedded in the encapsulation layer, the antenna is positioned on the encapsulation layer and electrically connected to the RF component. A rigid substrate is formed on a flexible substrate, and a receiving groove is defined in the rigid substrate to expose the flexible substrate. The communication unit is in the receiving groove, thus causing connection between the RF component and the flexible substrate, thereby the circuit board is formed.

18 Claims, 9 Drawing Sheets

CIRCUIT BOARD AND METHOD FOR MANUFACTURING THE SAME

FIELD

The subject matter herein generally relates to a circuit board and a method for manufacturing the circuit board.

BACKGROUND

Mobile communications require signal transmission of higher quality. 5G network can provide a higher speed of signal transmission compared to 4G network. Since 5G uses multiple-input and multiple-output (MIMO) technology, a number of antennas are presently included in a single circuit board, which increases the size of the circuit board.

BRIEF DESCRIPTION OF THE DRAWINGS

Implementations of the present technology will now be described, by way of embodiment, with reference to the attached figures.

DETAILED DESCRIPTION

Figure 1:
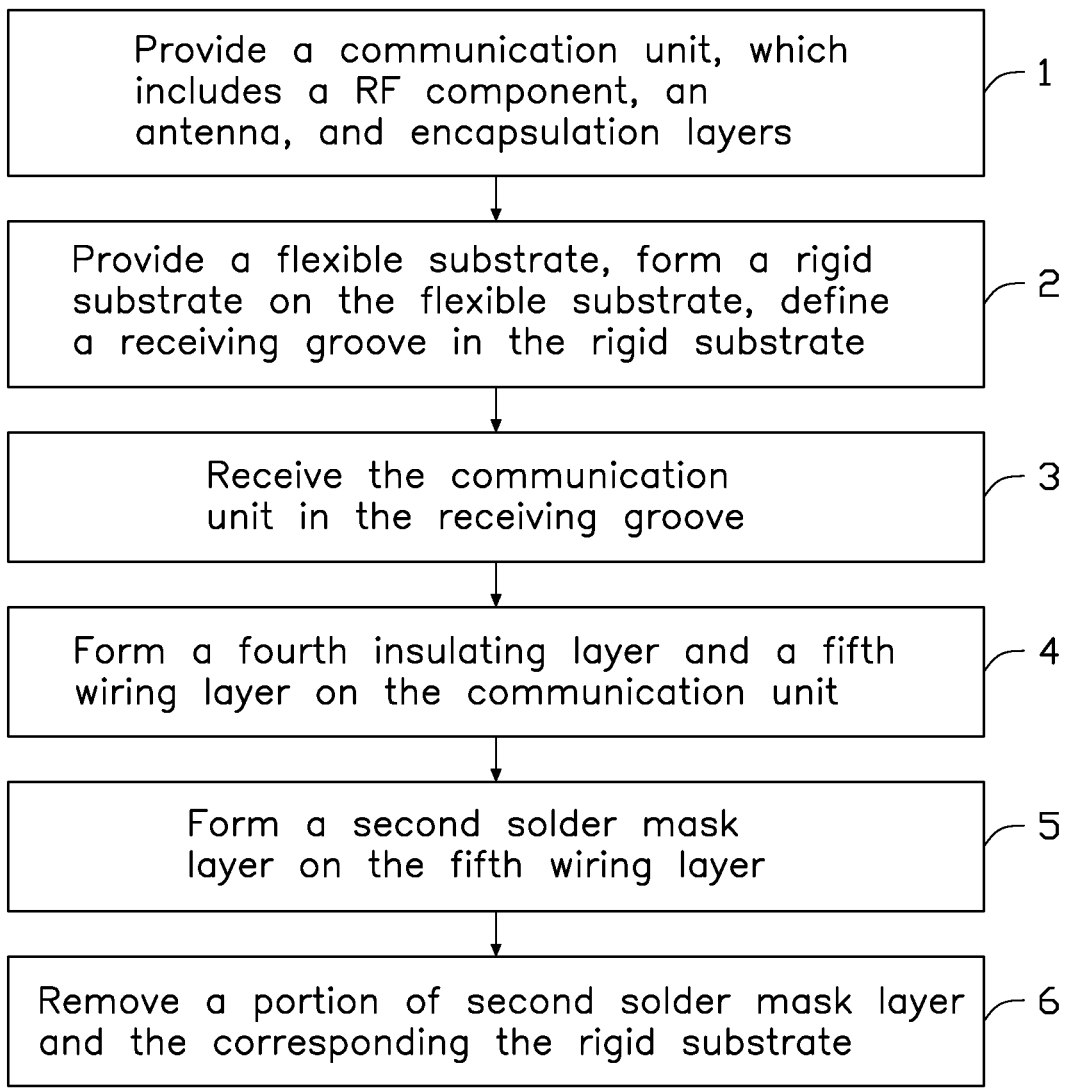
FIG. 1 is a flowchart of an embodiment of a method for manufacturing a circuit board.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Referring to FIG. 1, a method for manufacturing a circuit board is presented in accordance with an embodiment. The method is provided by way of example, as there are a variety of ways to carry out the method. The method can begin at block 1.

At block 1, referring to FIGS. 3-8, a communication unit 13 is provided, which includes a radio frequency component (RF component 136), an antenna 139, and an encapsulation layer 130. The RF component 136 is embedded in the encapsulation layer 130. The antenna 139 is positioned on the encapsulation layers 130 and electrically connected to the RF component 136.

Figure 2A:
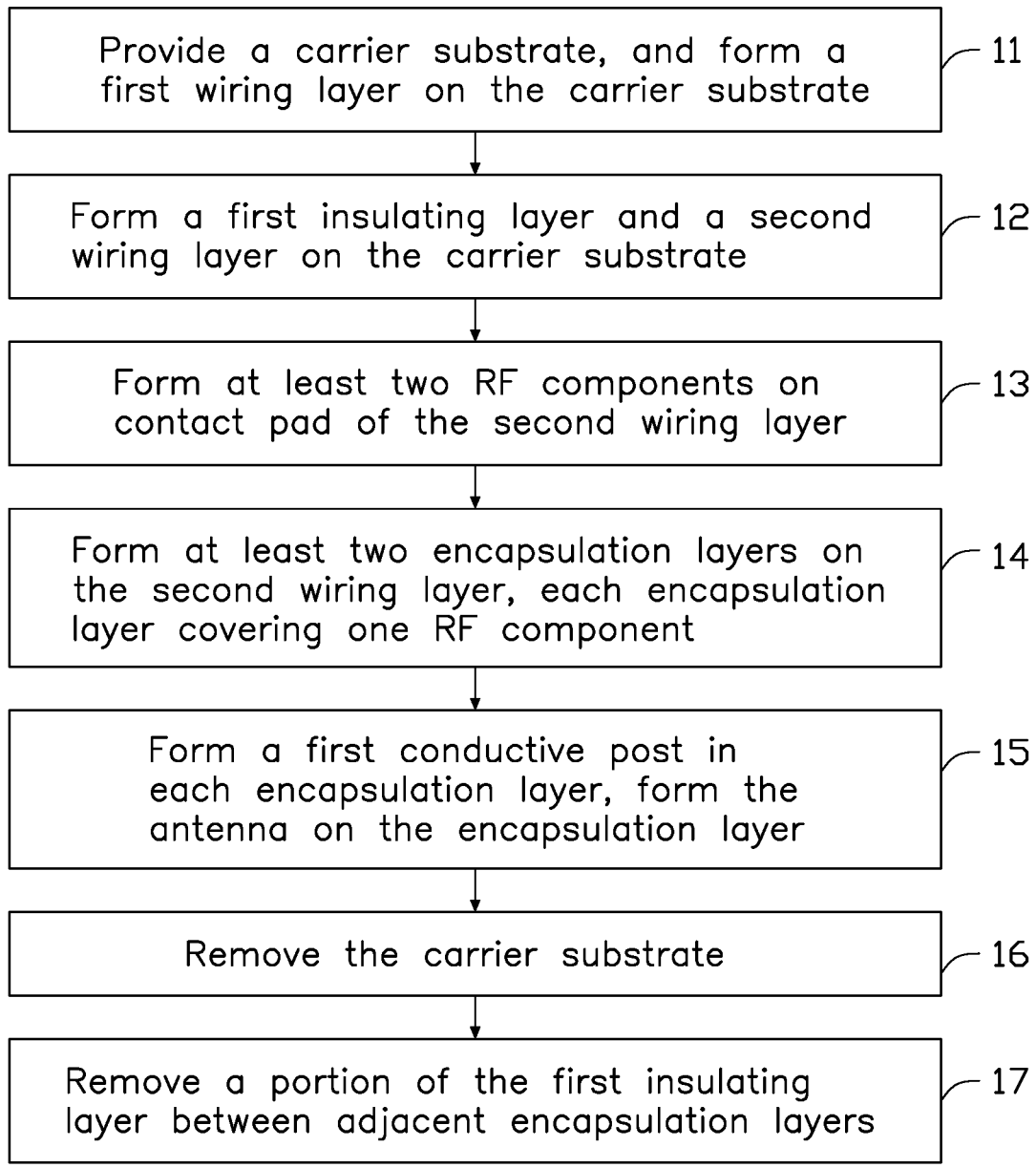
FIG. 2A is a sub-flowchart of block 1 of the method of FIG. 1.

In at least one embodiment, a method for forming the communication unit 13 is also provided, referring to FIG. 2A, the method begins at block 11.

At block 11, a carrier substrate 140 is provided, and a first wiring layer 132 is formed on the carrier substrate 140.

In at least one embodiment, a first seed layer (not shown) is first formed on the carrier substrate 140. A first copper layer (not shown) is then formed on the first seed layer by electroplating. The first copper layer is etched to form the first wiring layer 132, by lithographic exposure and development.

Figure 4:
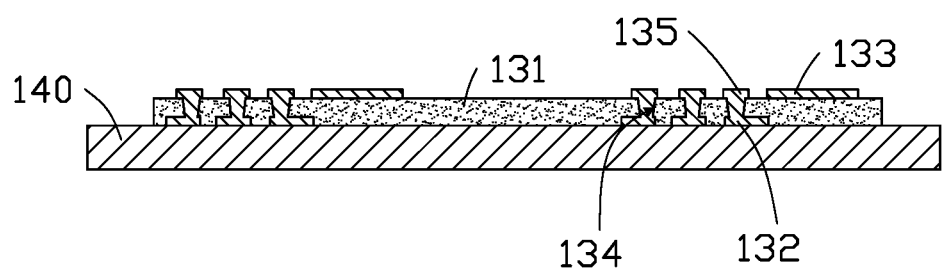
FIG. 4 is a diagrammatic view showing a first insulating layer and a second wiring layer formed on the carrier substrate of FIG. 3.

At block 12, referring to FIG. 4, a first insulating layer 131 is formed on the carrier substrate 140 and covers the first wiring layer 132. A number of first through holes 134 are defined in the first insulating layer 131, and a second copper layer (not shown) is formed on the first insulating layer 131 by electroplating. The second copper layer fills in the first through holes 134. The second copper layer is then etched to form a second wiring layer 133. A portion of the second wiring layer 133 corresponding to each first through hole 134 forms a contact pad 135. The contact pad 135 is electrically connected to the first wiring layer 132.

In at least one embodiment, the first through holes 134 can be formed by laser. In other embodiments, the first through holes 134 can be formed by mechanical cutting through a high pressure waterjet, an air knife, or a turning machine. The first through holes 134 can also be formed by chemical or physical etching.

Figure 5:
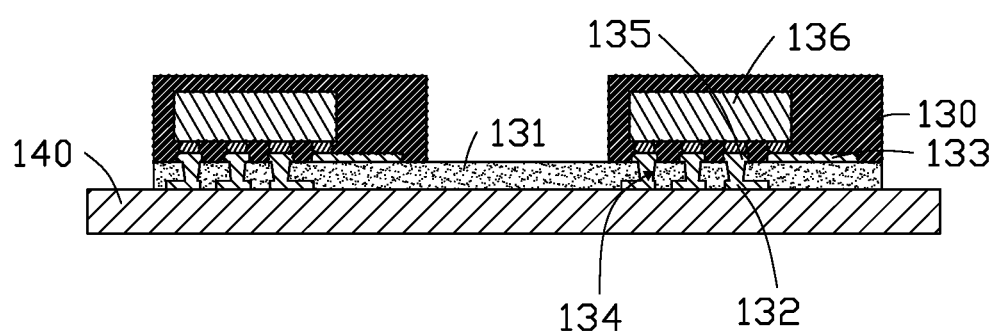
FIG. 5 is a diagrammatic view showing RF components formed on the second wiring layer of FIG. 4.

At block 13, referring to FIG. 5, at least two RF components 136 are formed on the contact pads 135.

In at least one embodiment, the RF component 136 is connected to the contact pad 135 by solder balls.

At block 14, at least two encapsulation layers 130 are formed on the second wiring layer 133, each encapsulation layer 130 covers one RF component 136.

The encapsulation layers 130 can be made of phenolic resin, epoxy resin, silicone resin, and silicon dioxide. The encapsulation layers 130 can be formed by compression molding, injection molding, or transfer molding. The encapsulation layers 130 can further infill the gaps between the first insulating layer 131 and a surface of the RF element 136 facing the second wiring layer 133.

Figure 6:
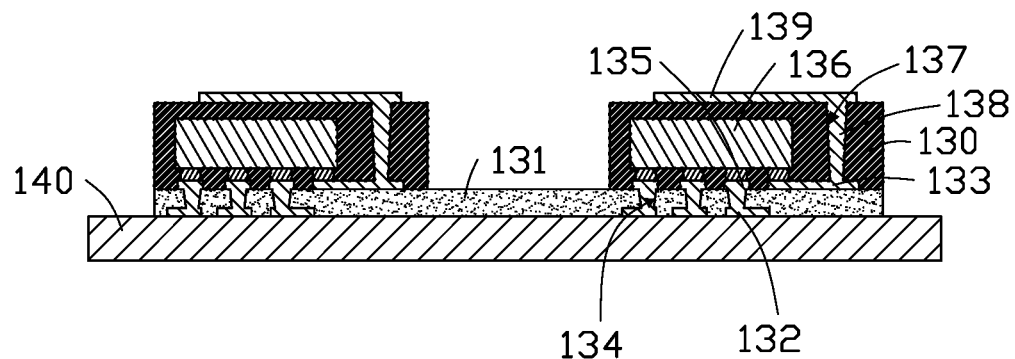
FIG. 6 is a diagrammatic view showing an antenna formed on each RF component of FIG. 5.

At block 15, referring to FIG. 6, a second through hole 137 is defined in each encapsulation layer 130. The second through hole 137 extends from a surface of the encapsulation layer 130 facing away from the second wiring layer 133 to the second wiring layer 133. A first conductive post 138 is formed in the second through hole 137, which is electrically connected to the second wiring layer 133. The antenna 139 is formed on the surface of the encapsulation layer 130 facing away from the second wiring layer 133, and is electrically connected to the first conductive post 138. The antenna 139 can be made of a conductive material such as copper, silver, or the combination thereof (alloy). The antenna 139 can be in shape of a square or a coil.

In at least one embodiment, the second through hole 137 can be formed by laser. In other embodiments, the second through hole 137 can be formed by mechanical cutting through a high pressure waterjet, an air knife, or a turning machine. The second through hole 137 can also be formed by chemical or physical etching. The first conductive post 138 can be formed by electroplating metal or filling conductive paste in the second through hole 137. The antenna 139 can be directly formed on the encapsulation layer 130, or formed by forming a second seed layer on the encapsulation layers 130, forming a third copper layer (not shown) on the second seed layer, and etching the third copper layer by lithographic exposure and development.

Figure 7:
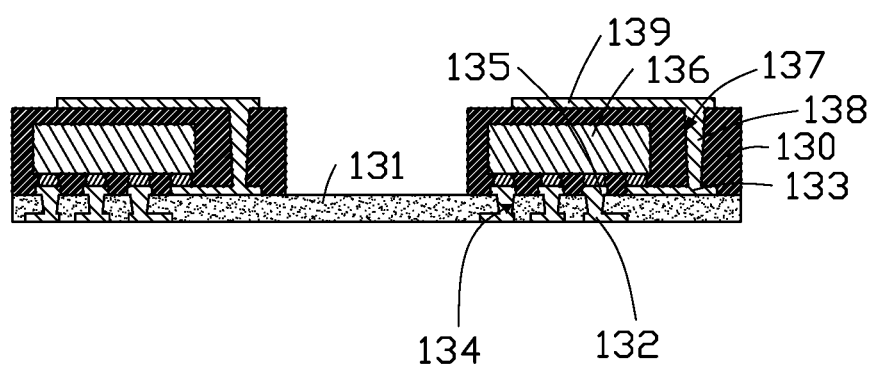
FIG. 7 is a diagrammatic view showing the carrier substrate of FIG. 6 removed.

At block 16, referring to FIG. 7, the carrier substrate 140 is removed.

Figure 8:
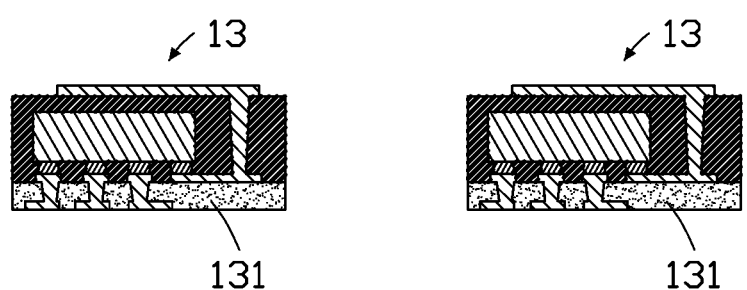
FIG. 8 is a diagrammatic view showing a portion of the first insulating layer of FIG. 7 removed.

At block 17, referring to FIG. 8, a portion of the first insulating layer 131 between adjacent encapsulation layers 130 is removed, thereby forming at least two communication units 13.

At block 2, referring to FIGS. 9-13, a flexible substrate 11 is provided. A rigid substrate 12 is formed on the flexible substrate 11. A receiving groove 125 is defined in the rigid substrate 12 to expose the flexible substrate 11.

Figure 2B:
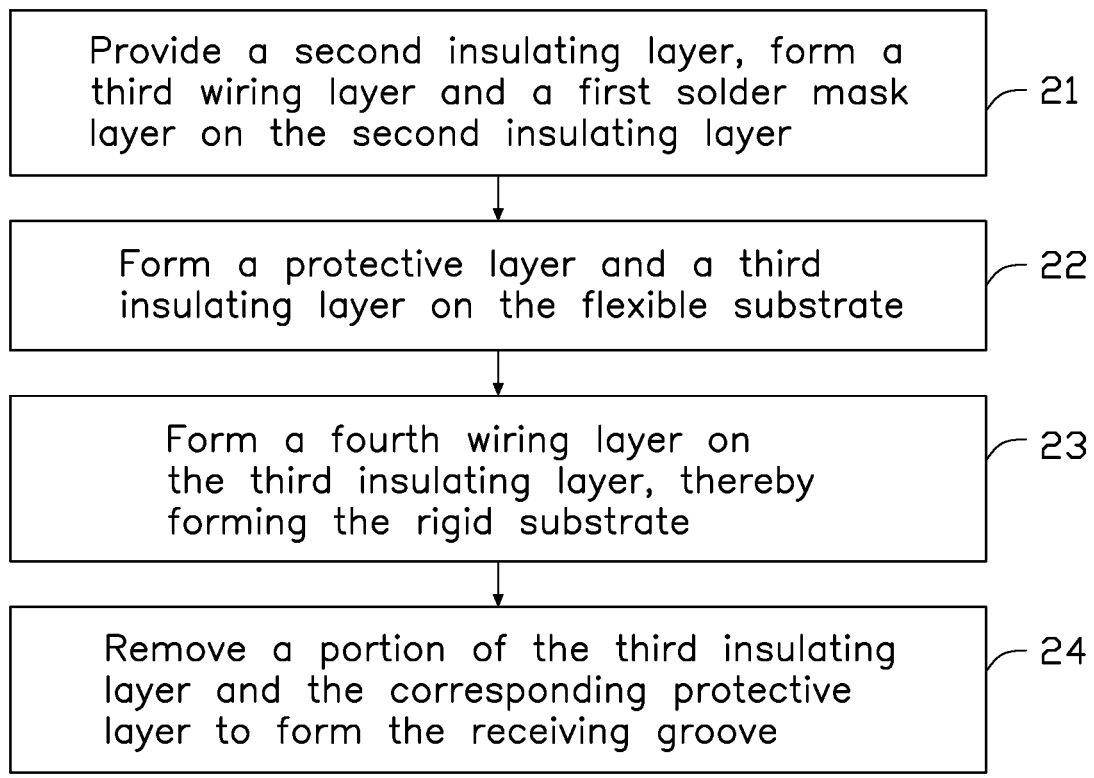
FIG. 2B is a sub-flowchart of block 2 of the method of FIG. 1.
Figure 3:
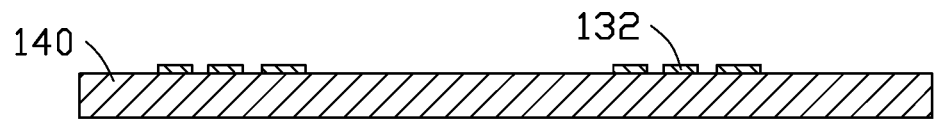
FIG. 3 is a diagrammatic view of a carrier substrate having a first wiring layer used in the method of FIG. 1.

In at least one embodiment, a method for forming the flexible substrate 11 and the rigid substrate 12 is also provided. Referring to FIG. 2B, the method begins at block 21.

Figure 9:
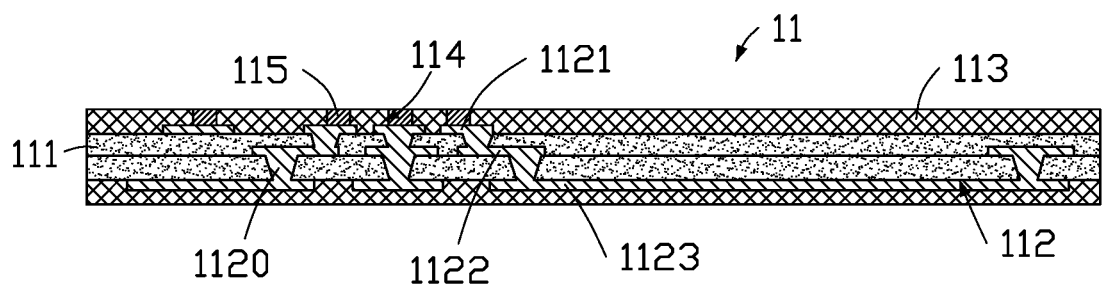
FIG. 9 is a diagrammatic view of a flexible substrate.

At block 21, referring to FIG. 9, a second insulating layer 111 is provided. A third wiring layer 112 and a first solder mask layer 113 are formed on the second insulating layer 111. A number of third through holes 114 are defined in the first solder mask layer 113 to expose a portion of the third wiring layer 112. Conductive paste is infilled in each third through hole 114 to form a second conductive post 115, which is electrically connected to the third wiring layer 112. Thus, the flexible substrate 11 is obtained.

In at least one embodiment, the second insulating layer 111 can be made of a resin selected from a group consisting of polyimide (PI), polyethylene naphthalene (PEN), polyethylene glycol terephthalate (PET), and any combination thereof.

In at least one embodiment, the third wiring layer 112 may include a first sub-wiring layer 1121, a second sub-wiring layer 1122, and a third sub-wiring layer 1123. The first sub-wiring layer 1121 and the third sub-wiring layer 1123 are formed on opposite surfaces of the flexible substrate 11. The second sub-wiring layer 1122 is positioned in the flexible substrate 11 and between the first sub-wiring layer 1121 and the third sub-wiring layer 1123. A number of conductive vias 1120 are formed in the flexible substrate 11, which electrically interconnect the first sub-wiring layer 1121, the second sub-wiring layer 1122, and the third sub-wiring layer 1123. The density of the first sub-wiring layer 1121 is less than the density of the second sub-wiring layer 1122, and the density of the second sub-wiring layer 1122 is less than the density of the third sub-wiring layer 1123.

The first solder mask layer 113 covers and protects the third wiring layer 112. In at least one embodiment, the first solder mask layer 113 may be formed by printing, spraying, or spin coating.

The third through holes 114 can be formed by laser. In other embodiments, the third through holes 114 can be formed by mechanical cutting through a high pressure waterjet, an air knife, or a turning machine.

Figure 10:
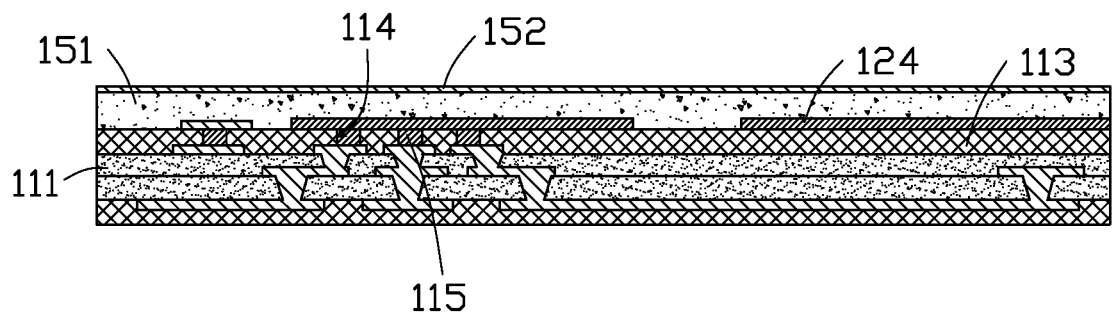
FIG. 10 is a diagrammatic view showing a protective layer and a third insulating layer formed on the flexible substrate of FIG. 9.

At block 22, referring to FIG. 10, a protective layer 124 and a third insulating layer 1210 are formed on the flexible substrate 11. The protective layer 124 covers at least the third through hole 114 and the second conductive post 115.

The protective layer 124 can be made of a material selected from a resin selected from a group consisting of polyimide (PI), polyethylene naphthalene (PEN), polyethylene glycol terephthalate (PET), and any combination thereof.

Figure 11:
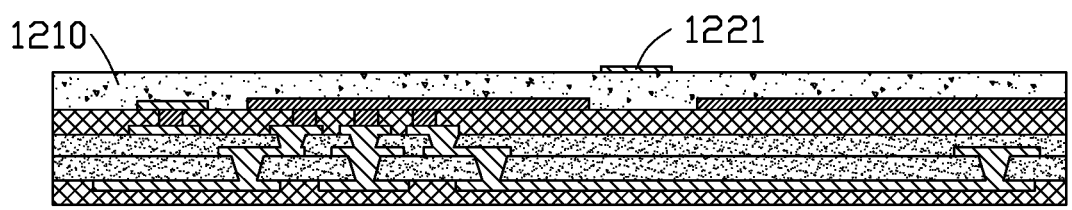
FIG. 11 is a diagrammatic view showing a fourth sub-wiring layer formed on the third insulating layer of FIG. 10.
Figure 12:
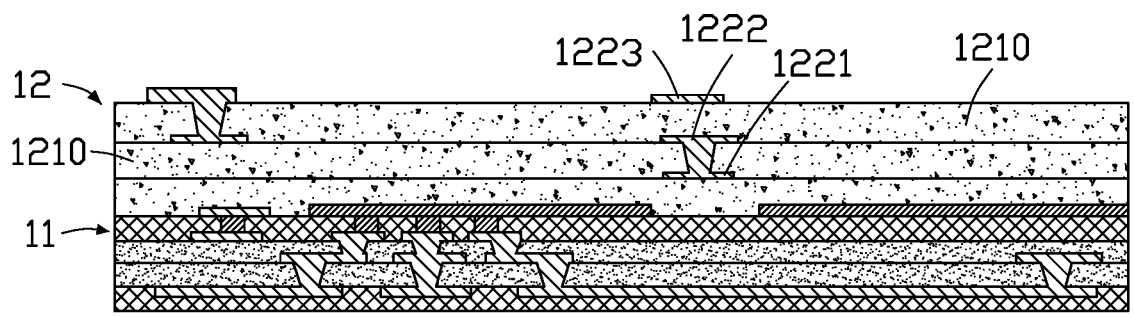
FIG. 12 is a diagrammatic view showing a fourth wiring layer formed on the third insulating layer of FIG. 11 to form a rigid substrate.

At block 23, referring to FIGS. 10-12, a fourth wiring layer 122 is formed on the third insulating layer 1210, thereby forming the rigid substrate 12.

In at least one embodiment, the fourth wiring layer 122 may include a fourth sub-wiring layer 1221, a fifth sub-wiring layer 1222, and a sixth sub-wiring layer 1223 which are interconnected. The sixth sub-wiring layer 1223 is formed on a surface of the third insulating layer 1210 facing away from the protective layer 124. The fifth sub-wiring layer 1222 is positioned between the fourth sub-wiring layer 1221 and the sixth sub-wiring layer 1223.

In at least one embodiment, referring to FIG. 10, a copper-clad laminate 151 is first formed on the protective layer 124, which includes a fourth copper layer 152. Referring to FIG. 11, the fourth copper layer 152 is etched to form the fourth sub-wiring layer 1221. Then, referring to FIG. 12, the fifth sub-wiring layer 1222 and the sixth sub-wiring layer 1223 are successively formed on the fourth sub-wiring layer 1221 by a building-up process, thereby forming the fourth wiring layer 122.

Figure 13:
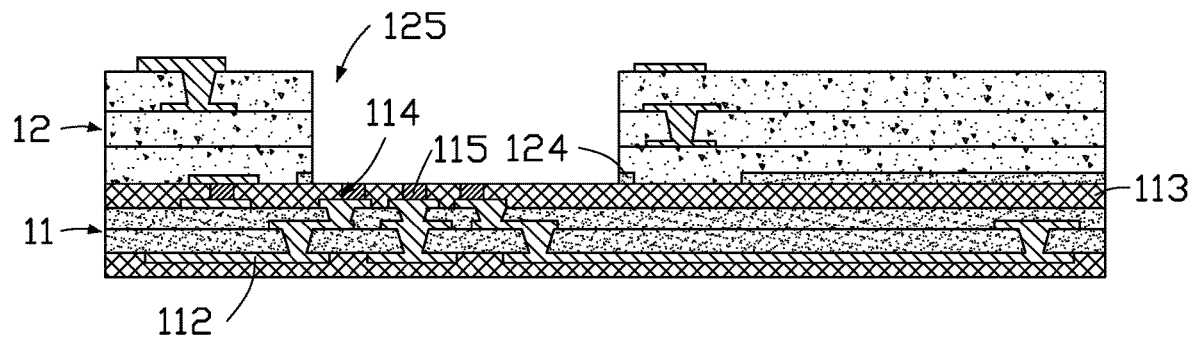
FIG. 13 is a diagrammatic view showing a receiving groove defined in the rigid substrate of FIG. 12.

At block 24, referring to FIG. 13, a portion of the third insulating layer 1210 and the corresponding protective layer 124 of the rigid substrate 12 are removed to form the receiving groove 125, which exposes the second conductive posts 115.

The receiving groove 125 can be formed by laser. In other embodiments, the receiving groove 125 can be formed by mechanical cutting through a high pressure waterjet, an air knife, or a turning machine. The receiving groove 125 can also be formed by chemical or physical etching. The protective layer 124 protects the flexible substrate 11 from being damaged during the formation of the receiving groove 125. The size of the receiving groove 125 is larger than that of the communication unit 13.

Figure 14:
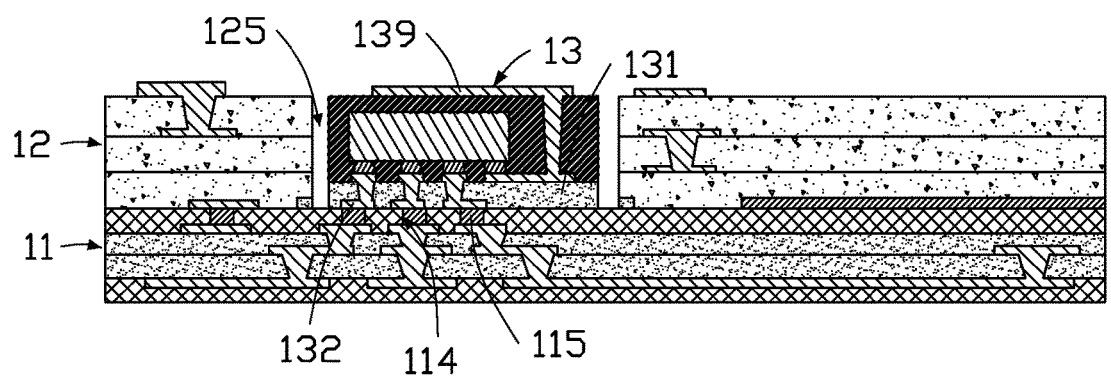
FIG. 14 is a diagrammatic view showing the communication unit received in the receiving groove of FIG. 13.

At block 3, referring to FIG. 14, the communication unit 13 is received in the receiving groove 125, causing the RF component 136 to be electrically connected to the flexible substrate 11.

In at least one embodiment, the RF component 136 is electrically connected to the second conductive posts 115 of the flexible substrate 11 through the first wiring layer 132.

Figure 15:
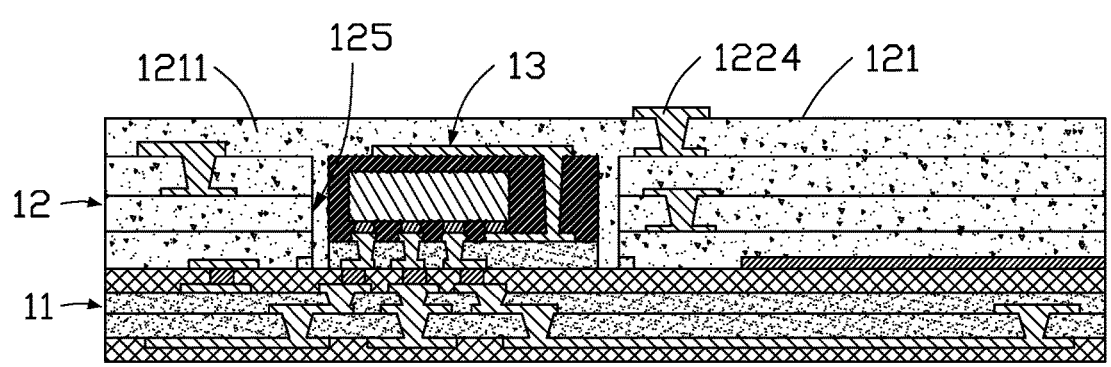
FIG. 15 is a diagrammatic view showing a fourth insulating layer and a fifth wiring layer formed on the communication unit of FIG. 13.

At block 4, referring to FIG. 15, a fourth insulating layer 1211 is formed on the communication unit 13 and infills the receiving groove 125. A fifth wiring layer 1224 is formed on the fourth insulating layer 1211.

Figure 16:
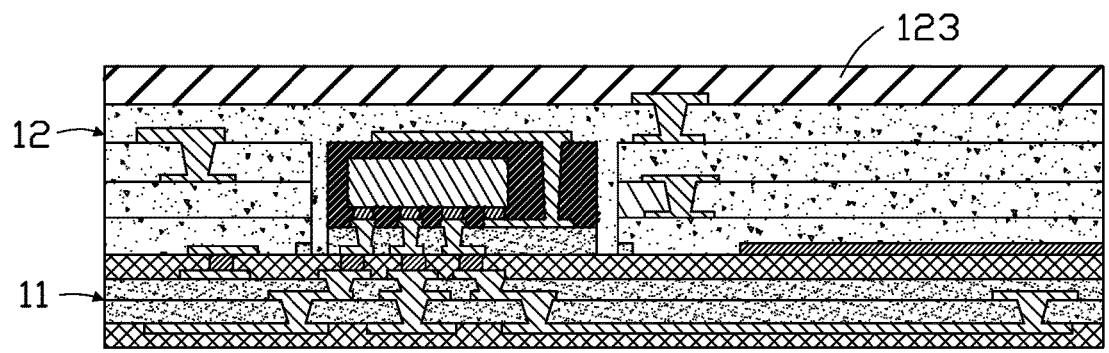
FIG. 16 is a diagrammatic view showing a second solder mask layer formed on the fifth wiring layer of FIG. 15.

At block 5, referring to FIG. 16, a second solder mask layer 123 is formed on the fifth wiring layer 1224.

The second solder mask layer 123 may be formed by printing, spraying, or spin coating.

Figure 17:
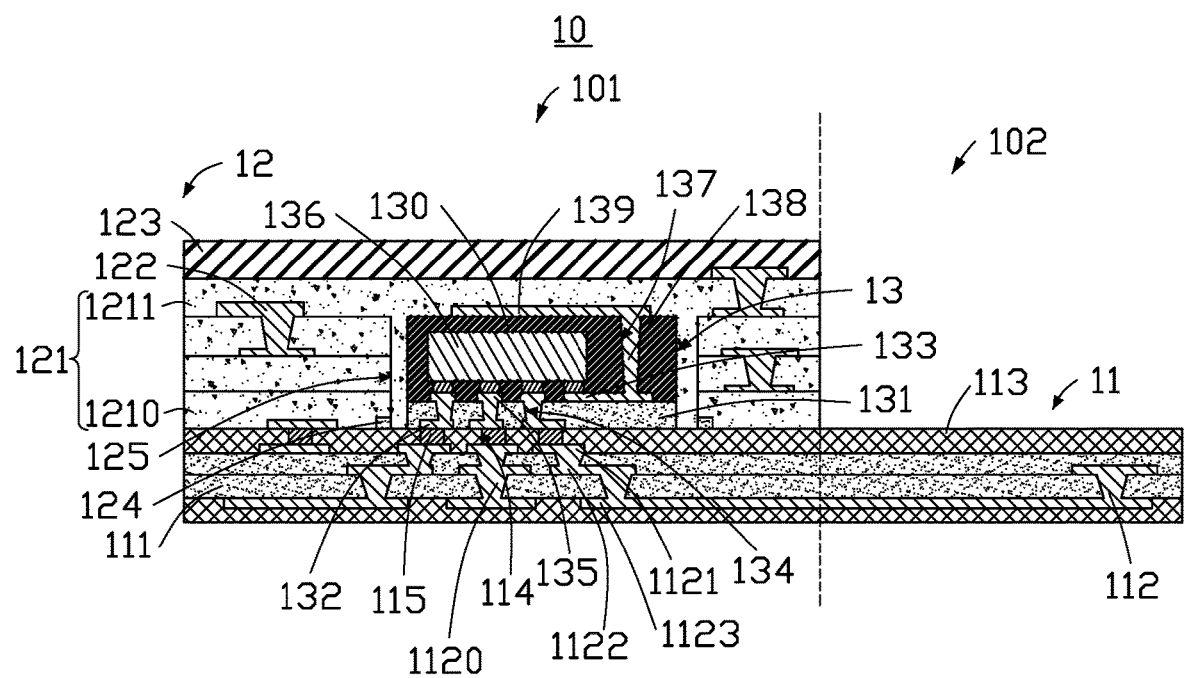
FIG. 17 is a diagrammatic view showing a portion of the second solder mask layer and the rigid substrate of FIG. 16 removed so as to form a circuit board.

At block 6, referring to FIG. 17, a portion of second solder mask layer 123 and the corresponding rigid substrate 12 are removed to expose the flexible substrate 11, thereby obtaining the circuit board 10.

FIG. 17 illustrates an embodiment of a circuit board 10 that includes a flexible substrate 11 and a rigid substrate 12 formed on at least a portion of the flexible substrate 11. The rigid substrate 12 defines at least one receiving groove 125. A communication unit 13 is received in each receiving groove 125. The communication unit 13 includes an RF component 136, an antenna 139, and an encapsulation layer 130. The RF component 136 is embedded in the encapsulation layer 130, and is electrically connected to the flexible substrate 11. The antenna 139 is positioned on the encapsulation layer 130 and is electrically connected to the RF component 136. The rigid substrate 12 and the corresponding flexible substrate 11 define a rigid area 101 of the circuit board 10. The remaining flexible substrate 11 defines a flexible area 102 of the circuit board 10.

In at least one embodiment, the communication unit 13 further includes a first insulating layer 131, a first wiring layer 132, and a second wiring layer 133 electrically interconnected. The first insulating layer 131 and the first wiring layer 132 are formed on the flexible substrate 11, and the first insulating layer 131 covers the first wiring layer 132. The second wiring layer 133 is formed on the first insulating layer 131. The first insulating layer 131 defines at least one first through hole 134, and the second wiring layer 133 further infills the first through hole 134. A portion of the second wiring layer 133 corresponding to each first through hole 134 forms a contact pad 135. The contact pad 135 is electrically connected to the first wiring layer 132. The RF component 136 is formed on the first insulating layer 131, and is electrically connected to each contact pad 135 through a solder ball. The encapsulation layer 130 defines a second through hole 137. The second through hole 137 extends from a surface of the encapsulation layer 130 facing away from the second wiring layer 133 to the second wiring layer 133. A first conductive post 138 is formed in the second through hole 137, which is electrically connected to the second wiring layer 133. The antenna 139 is formed on the surface of the encapsulation layer 130 facing away from the second wiring layer 133, and is electrically connected to the first conductive post 138.

Furthermore, the communication unit 13 can further includes a passive component (not shown), such as a capacitor. The passive component is electrically connected between the RF component 136 and the antenna 139 for signal processing. The passive component can be embedded in the encapsulation layer 130, and is electrically connected to the second wiring layer 133.

In operation, the flexible substrate 11 transmits a driving signal to the RF component 136. The RF component 136 receives the driving signal, and further transmits a control signal to the antenna 139 through the second wiring layer 133 and the first conductive post 138. The antenna 139 can also receive an electrical signal, and the RF component 136 can analyze the electrical signal received by the antenna 139.

In at least one embodiment, the flexible substrate 11 includes a second insulating layer 111, a third wiring layer 112, and a first solder mask layer 113 formed on the second insulating layer 111. A number of third through holes 114 are defined in the first solder mask layer 113 to expose a portion of the third wiring layer 112. Conductive paste is infilled in each third through hole 114 to form a second conductive post 115, which is electrically connected to the third wiring layer 112. The third wiring layer 112 is electrically connected to the first insulating layer 131 through each second conductive post 115.

The third wiring layer 112 may include a first sub-wiring layer 1121, a second sub-wiring layer 1122, and a third sub-wiring layer 1123. The first sub-wiring layer 1121 and the third sub-wiring layer 1123 are formed on opposite surfaces of the flexible substrate 11. The second sub-wiring layer 1122 is positioned in the flexible substrate 11 between the first sub-wiring layer 1121 and the third sub-wiring layer 1123. A number of conductive vias 1120 are formed in the flexible substrate 11, which electrically interconnect the first sub-wiring layer 1121, the second sub-wiring layer 1122, and the third sub-wiring layer 1123. The density of the first sub-wiring layer 1121 is less than the density of the second sub-wiring layer 1122, and the density of the second sub-wiring layer 1122 is less than the density of the third sub-wiring layer 1123.

In at least one embodiment, the rigid substrate 12 includes an insulating substrate 121, a second solder mask layer 123, and a fourth wiring layer 122. The insulating substrate 121 may include a third insulating layer 1210 formed on the flexible substrate 11 and a fourth insulating layer 1211 formed on the third insulating layer 1210, thus achieving a desired thickness of the insulating substrate 121. The third insulating layer 1210 and the fourth insulating layer 1211 can be made of same or different materials. For example, the third insulating layer 1210 and the fourth insulating layer 1211 can be made of a rigid material including a resin and fibers impregnated in the resin. The fibers can be glass fibers or organic fibers. The resin can be epoxy resin, polyimide resin, bismaleimide triazine (BT) resin, polyphenylene ether (PPE) resin, or polyphenylene oxide (PPO) resin. The third insulating layer 1210 and the fourth insulating layer 1211 can also be made of porous films such as polyimide (PI) films, aromatic polyamide films, polytetrafluoroethylene (PTFE) films, or liquid crystal polymer (LCP) films, and a resin filled in the porous films. The resin can be epoxy resin, polyimide resin, bismaleimide triazine (BT) resin, polyphenylene ether (PPE) resin, or polyphenylene oxide (PPO) resin. The third insulating layer 1210 and the fourth insulating layer 1211 can also be made of polyimide (PI) films, aromatic polyamide films, liquid crystal polymer (LCP) films, and adhesive connecting therebetween.

The fourth wiring layer 122 may include a fourth sub-wiring layer 1221, a fifth sub-wiring layer 1222, and a sixth sub-wiring layer 1223 electrically interconnected. The sixth sub-wiring layer 1223 is formed on the third insulating layer 1210. The fifth sub-wiring layer 1222 is positioned between the fourth sub-wiring layer 1221 and the sixth sub-wiring layer 1223.

The receiving groove 125 passes through the third insulating layer 1210. The fourth insulating layer 1211 fills in the gaps between the receiving groove 125 and the communication unit 13. The material of the second third insulating layer 1210 may be a dielectric insulating material. The second solder mask layer 123 is formed on a surface of the insulating substrate 121 away from the flexible substrate 11. The rigid substrate 12 further includes a protective layer 124 formed on the surface of the flexible substrate 11. The protective layer 124 covers at least the third through hole 114 and the second conductive post 115, and protects the flexible substrate 11 from being damaged during the preparation of the rigid substrate 12.

Figure 18:
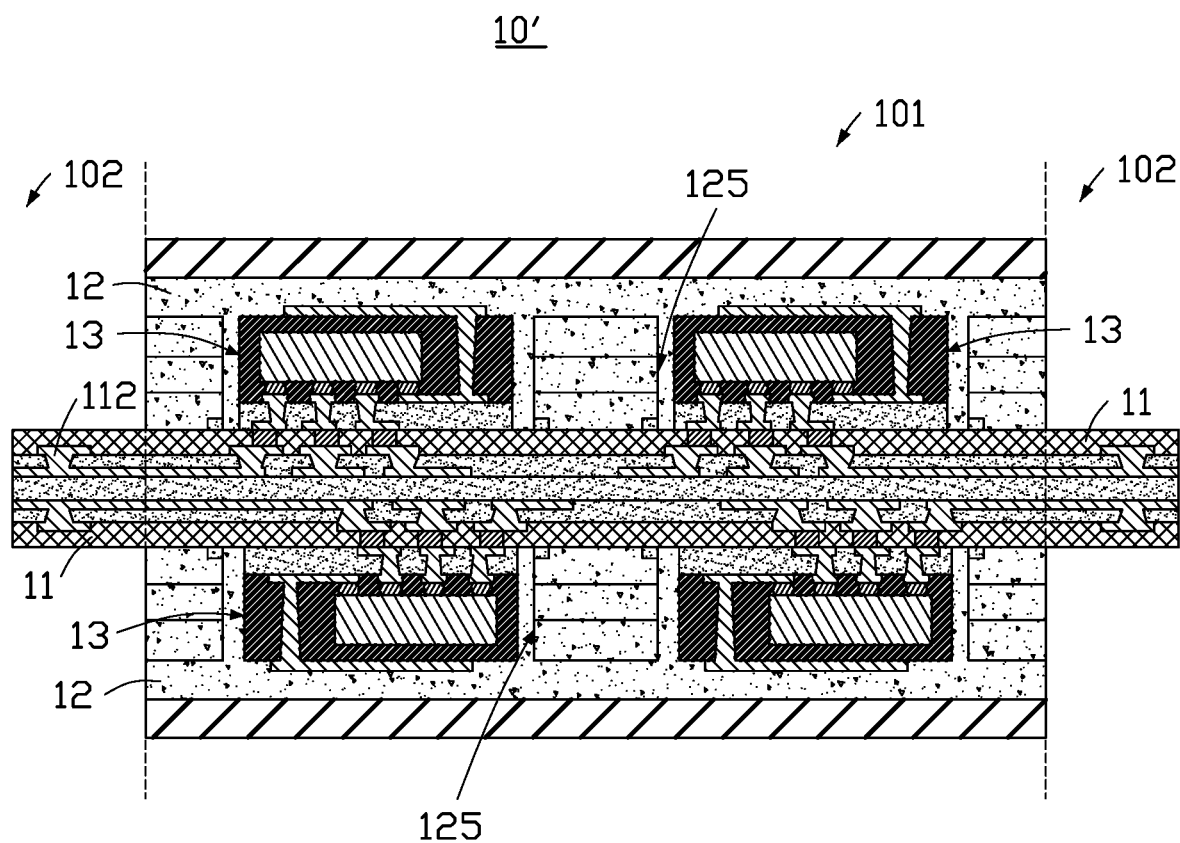
FIG. 18 is a diagrammatic view of another embodiment of a circuit board.

FIG. 18 illustrates another embodiment of a circuit board (circuit board 10'). Different from the circuit board 10, the circuit board 10' includes at least two rigid substrates 12 positioned at opposite surfaces of the flexible substrate 11. Each rigid substrate 12 defines at least two receiving spaces 125. At least two communication units 13 are included, each being received in one receiving space 125. The communication units 13 may be symmetrical with respect to a direction parallel to the flexible substrate 11, and may also symmetrical with respect to a direction perpendicular to the flexible substrate 11.

With the above configuration, the circuit board 10 (10') has a small size by embedding the communication unit 13 into the rigid substrate 12. The rigid substrate 12 can also fix the communication unit 13 and protect the communication unit 13 from being damaged. Furthermore, the communication unit 13 can transmit and receive signals since the communication unit 13 is electrically connected to the flexible substrate 11. Since at least two communication units 13 can be obtained simultaneously, the method of the present disclosure simplifies the manufacturing process of the circuit board.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A method for manufacturing a circuit board comprising:
    provide a carrier substrate, forming a first wiring layer on the carrier substrate;
    forming at least two radio frequency components on the first wiring layer, the radio frequency components electrically connected to the first wiring layer;
    forming at least two encapsulation layers on the first wiring layer, the radio frequency components embedded in the encapsulation layers;
    forming at least two antennas on the encapsulation layer, which is electrically connected to the first wiring layer;
    removing the carrier substrate;
    removing a portion of the first insulating layer between adjacent encapsulation layers, thereby forming at least two communication units;
    providing a flexible substrate;
    forming a rigid substrate on the flexible substrate;
    defining a receiving groove in the rigid substrate to expose the flexible substrate;
    disposing one of the communication units in the receiving groove, causing the radio frequency component to be electrically connected to the flexible substrate through the first wiring layer, thereby forming the circuit board.

2. The method of claim 1, wherein providing the communication unit further comprises:
    forming a second wiring layer on the first insulating layer, the second wiring layer comprising at least two contact pads electrically connected to the first wiring layer, wherein the radio frequency components are formed on the contact pads;
    forming a first conductive post in each of the encapsulation layers, which is electrically connected to the second wiring layer, wherein the antenna is electrically connected to first conductive post.

3. The method of claim 1, wherein providing the flexible substrate comprises:
    providing a second insulating layer;
    forming a third wiring layer and a first solder mask layer on the second insulating layer;
    defining at least two through holes in the first solder mask layer to expose a portion of the third wiring layer;
    forming a second conductive post in each of the through holes, which is electrically connected to the third wiring layer, thereby forming the flexible substrate.

4. The method of claim 3, wherein the third wiring layer comprises a first sub-wiring layer, a second sub-wiring layer, and a third sub-wiring layer, the first sub-wiring layer and the third sub-wiring layer are formed on opposite surfaces of the flexible substrate, the second sub-wiring layer is positioned in the flexible substrate and between the first sub-wiring layer and the third sub-wiring layer, at least two conductive vias are formed in the flexible substrate, which electrically connect the first sub-wiring layer, the second sub-wiring layer, and the third sub-wiring layer to each other.

5. The method of claim 4, wherein a density of the first sub-wiring layer is less than a density of the second sub-wiring layer, and the density of the second sub-wiring layer is less than a density of the third sub-wiring layer.

6. The method of claim 3, wherein providing the rigid substrate comprises:
    forming a protective layer and a third insulating layer on the flexible substrate, the protective layer at least covering each second conductive post;
    forming a fourth wiring layer on the third insulating layer, thereby forming the rigid substrate.

7. The method of claim 6, wherein the fourth wiring layer comprises a fourth sub-wiring layer, a fifth sub-wiring layer, and a sixth sub-wiring layer connected to each other, the sixth sub-wiring layer is formed on a surface of the third insulating layer facing away from the protective layer, the fifth sub-wiring layer is positioned between the fourth sub-wiring layer and the sixth sub-wiring layer.

8. The method of claim 6, wherein a portion of the third insulating layer and corresponding protective layer of the rigid substrate are removed to form the receiving groove, the receiving groove exposes each second conductive post, and the radio frequency component is electrically connected to each second conductive post.

9. The method of claim 6, further comprising:
    forming a fourth insulating layer on the communication unit, which fills in the receiving groove;
    forming a fifth wiring layer on the fourth insulating layer;
    forming a second solder mask layer on the fifth wiring layer; and
    removing a portion of second solder mask layer and corresponding the rigid substrate to expose the flexible substrate.

10. A circuit board comprises:
    a flexible substrate; and
    a rigid substrate formed on the flexible substrate, the rigid substrate defining at least one receiving groove; and
    a communication unit is received in each receiving groove, the communication unit comprising a radio frequency component, an antenna, and an encapsulation layer, the radio frequency component embedded in the encapsulation layer and electrically connected to the flexible substrate, the antenna positioned on the encapsulation layer and electrically connected to the radio frequency component, wherein the communication unit further comprises a first wiring layer, the first wiring layer is disposed between the radio frequency component and the flexible substrate, and electrically connected to the radio frequency component and the flexible substrate.

11. The circuit board of claim 10, wherein the communication unit further comprises a first insulating layer and a second wiring layer, the first insulating layer is formed on the flexible substrate and covers the first wiring layer, the second wiring layer is formed on the first insulating layer, the first insulating layer defines at least one first through hole, the second wiring layer further fills in the first through hole, a portion of the second wiring layer corresponding to each first through hole forms a contact pad, the contact pad is electrically connected to the first wiring layer, the radio frequency component is formed on the first insulating layer and electrically connected to each contact pad, the encapsulation layer defines a second through hole, the second through hole extends from a surface of the encapsulation layer facing away from the second wiring layer to the second wiring layer, a first conductive post is formed in the second through hole, which is electrically connected to the second wiring layer, the antenna is formed on the encapsulation layer and electrically connected to the first conductive post.

12. The circuit board of claim 10, wherein the flexible substrate comprises a second insulating layer, a third wiring layer, and a first solder mask layer formed on the second insulating layer, at least two third through holes are defined in the first solder mask layer to expose a portion of the third wiring layer, a second conductive post is formed in each of the third through holes, which is electrically connected to the third wiring layer, the third wiring layer is electrically connected to the first insulating layer through the second conductive posts.

13. The circuit board of claim 12, wherein the third wiring layer comprises a first sub-wiring layer, a second sub-wiring layer, and a third sub-wiring layer electrically connected to each other, the first sub-wiring layer and the third sub-wiring layer are formed on opposite surfaces of the flexible substrate, the second sub-wiring layer is positioned in the flexible substrate and between the first sub-wiring layer and the third sub-wiring layer, at least two of conductive vias are formed in the flexible substrate, which electrically connect the first sub-wiring layer, the second sub-wiring layer, and the third sub-wiring layer to each other.

14. The circuit board of claim 13, wherein a density of the first sub-wiring layer is less than a density of the second sub-wiring layer, and the density of the second sub-wiring layer is less than a density of the third sub-wiring layer.

15. The circuit board of claim 12, wherein the rigid substrate further comprises a protective layer formed on the flexible substrate, and at least covers the second conductive post.

16. The circuit board of claim 10, wherein the rigid substrate comprises an insulating substrate, a second solder mask layer, and a fourth wiring layer, the insulating substrate comprises a third insulating layer formed on the flexible substrate and a fourth insulating layer formed on the third insulating layer, the fourth wiring layer comprises a fourth sub-wiring layer, a fifth sub-wiring layer, and a sixth sub-wiring layer electrically connected to each other, the sixth sub-wiring layer is formed on a surface of the third insulating layer facing away from the protective layer, the fifth sub-wiring layer is positioned between the fourth sub-wiring layer and the sixth sub-wiring layer, the second solder mask layer is formed on a surface of the insulating substrate away from the flexible substrate.

17. The circuit board of claim 16, wherein the receiving groove passes through the third insulating layer, the fourth insulating layer fills in gaps between the receiving groove and the communication unit.

18. The circuit board of claim 10, wherein the circuit board comprises at least two rigid substrates positioned at opposite surfaces of the flexible substrate, each of the rigid substrates defines at least two receiving spaces and each of the receiving space configured to receive one communication unit.

* * * * *